United States Patent [19]

Duboz et al.

[11] Patent Number: 5,677,544

[45] Date of Patent: Oct. 14, 1997

[54] QUANTUM WELL DETECTOR AND PROCESS FOR THE MANUFACTURE THEREOF

[75] Inventors: Jean-Yves Duboz, Cachan; François Luc, Neuilly/Seine; Philippe Bois, Cesson, all of France

[73] Assignee: Thomson-CSF, Paris, France

[21] Appl. No.: 309,342

[22] Filed: Sep. 9, 1994

[30] Foreign Application Priority Data

Sep. 10, 1993 [FR] France .................... 93 10782

[51] Int. Cl.$^6$ .................... H01L 29/06; H01L 31/0328; H01L 31/0336; H01L 31/072
[52] U.S. Cl. .................... 257/21; 257/14; 257/436; 385/37; 250/338.4
[58] Field of Search .................... 257/14, 21, 436; 385/37; 250/338.4

[56] References Cited

U.S. PATENT DOCUMENTS

| 5,026,148 | 6/1991 | Wen et al. | 350/386 |
| 5,075,749 | 12/1991 | Chi et al. | 357/30 |
| 5,272,356 | 12/1993 | Wen et al. | 257/21 |

*Primary Examiner*—Sara W. Crane
*Assistant Examiner*—Douglas Wille
*Attorney, Agent, or Firm*—Oblon, Spivak, McClelland, Maier & Neustadt, P.C.

[57] ABSTRACT

Quantum well detector, in which the active detection zone (2) occupies only a limited area of the device and in which a diffraction grid (5) having a larger surface area than this zone thereby makes it possible to couple to it a greater light flow than that corresponding to the surface area of this zone. In this way, the sensitivity of the device is increased.

Application: Detection of optical radiation.

9 Claims, 2 Drawing Sheets

QUANTUM WELL DETECTOR AND PROCESS FOR THE MANUFACTURE THEREOF

The invention concerns a quantum well detector used to detect optical waves within a determinate range of wavelengths, and the process for the manufacture thereof.

Quantum wells have been suggested as an alternative to existing infrared detectors, in particular HgCdTe, within the range of from 3 to 20 μm (see E. Rosencher, B. Vinter, and B. Levine, ed., *Intersubband Transitions in Quantum Wells* Plenum, London 1992). The electronic transition between quantified levels in an quantum well occurs at a wavelength which depends on the geometry of the well (width and depth). When the well is produced in a conduction band belong to the GaAs/AlGaAs system, the transition adheres to a strict rule of selection: absorption is proportional to the square of the component of the electric field in the direction of the axis of increase. Accordingly, absorption at normal incidence is null in a bare layer (without coupling device). Under a non-null incidence, absorption remains limited by refraction at the air/GaAs interface, which prohibits angles greater than 17° within the substrate. Solutions intended to increase coupling and, in particular, to obtain effective coupling at zero incidence (case of a matrix) have been proposed (see, for example, the article of G. Hasnain, B. F. Levine, C. G. Bethea, R. A. Logan, J. Walker, and R. J. Malik, *Appl. Phys. Lett.*, 54, 2515 (1989)). The best solution now applied consists in constructing a grid on the front face of the detector. The incident light along the axis of growth z is diffracted and propagated after diffraction in directions determined by the geometry of the grid, the angle of incidence, and the wavelength. It has been shown that optimal coupling occurs when the grid spacing equals the wavelength. In this case, the directions in which diffraction occurs are reduced to orders of 1 and −1, which are propagated parallel to the layers and are thus absorbed in large quantities.

The principal current restriction is the operating temperature. At 10 μnm, quantum multiwells reach optimal performance below the temperature $T^{BLIP}$, which is approximately 70 K.

This temperature is too low to allow quantum multiwells to be used easily and at reasonable cost. It is of primary importance to be able to work either above T=77K (liquid nitrogen) or above 70K (limit of present-day one-stage thermal machines). This increase of operating temperatures passes through a reduction of the heat-activated dark current, while preserving the same photoresponse.

Another limitation exhibited by the detectors is the surface area. It is difficult to manufacture detectors having a surface area very much greater than 1 mm² but without defects. A defect can short-circuit the functional zone and impart to the dark current too high a value. We should note that the problem is even trickier in HgCdTe detectors.

The solution proposed is a geometric one: it may supplement any form of dark current reduction by band production or by change of material or of transmission mode (valence band well, band-to-band transition), and to any wavelength. This solution may also be implemented in HgCdTe-type detectors. The same concept can be applied in the field of electro-optical modulators.

The purpose of the invention lies in the reduction of the active absorbent zone by preserving the photon-interception surface. The article of R. L. Whitney, F. W. Adams, and K. F. Cuff, in *Intersubband Transitions in Quantum Wells*, E. Rosencher, B. Vinter, and B. Levine, ed. (Plenum, London, 1922), p. 93, mentions the possibility of using microlenses produced on the rear face of the substrate and of focusing the light on an active zone having a smaller surface area.

The invention concerns a device based on a different principle.

The invention thus relates to a quantum well for detection of optical waves within a determinate range of wavelengths, characterized by the fact that it comprises:

on a delimited area of one face of a substrate, a stack of layers forming at least on quantum well capable of detecting optical waves;

on either side of this area and on the same face of the substrate, at least one layer of a transparent material which does not absorb optical waves and which has a thickness substantially equal to that of the stack of layers;

above the stack of layers and the layer of transparent material, a diffraction grid whose surface area is larger than that of the area occupied by the stack of layers;

a first conductive electrode positioned on the substrate in contact with the stack of layers, and a second conductive electrode positioned on the stack of layers.

The invention also concerns a process for producing a detector, characterized by the fact that it entails the following different steps:

production on a substrate of a conductive layer and of a stack of layers forming at least one quantum well;

etching of the stack of layers to remove any material form this stack not contained in a delimited zone;

epitaxy of a transparent material around said area;

etching of a diffraction grid on the upper surface of the stack of layers and of the transparent material;

production of a conductive element above the stack of layers.

According to a variant of the process according to the invention, instead of etching of the stack of layers followed by epitaxy around said zone, it is possible to produce an implantation which insulates the portion of the stack of layers not contained in that zone.

The different objects and features of the invention will emerge more clearly in the following description provided as an example, and in the attached drawings, in which.

Figure 1:
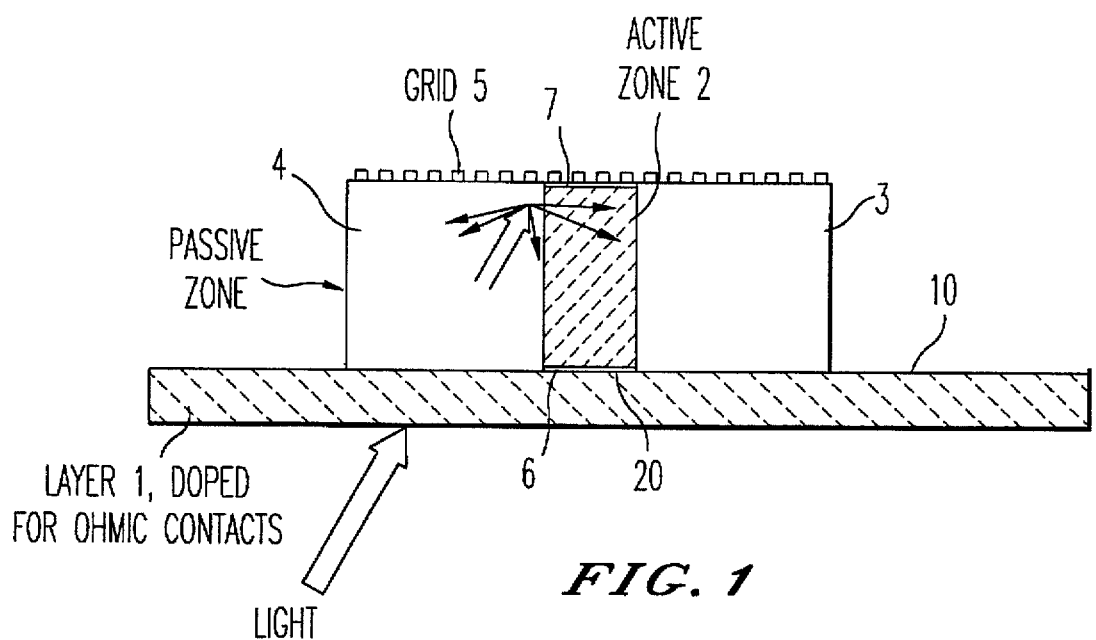
FIG. 1 is an embodiment of the detector according to the invention.

With reference to FIG. 1, we will thus first describe an embodiment of a detector according to the invention.

This detector comprises an active zone incorporating a stack of layers 2 forming at least one quantum well and located in an area 20 on a face 10 of a substrate 1. On either side of the stack of layers there is a material 3, 4 which is transparent to the optical waves to be detected. Above the assembly thus formed is a diffraction grid 5. Moreover, the detector incorporates an electrode 6 in contact with the lower face of the stack of layers 2 and an electrode 7 in contact with the upper face. These electrodes make possible the connection of an electric current-detection device.

The material 3, 4 has substantially the same index of refraction as the stack of layers 2.

According to one embodiment, the substrate is transparent and the light enters the detector through the substrate. It reaches the diffraction grid 5, which diffracts it obliquely in relation to the plane of the substrate.

To this end and according to a preferred embodiment, the surface of the substrate is metallized so that the light remains inside the device. Furthermore, the lateral faces, such as 21, 22 of the detector are treated so as to be reflective (e.g., metallized), also to keep the light inside the detector.

The diffraction grid 5 may be etched. Moreover, it can then be metallized. The diffraction grid 5 can also be a grid composed of metallized strips.

According to another embodiment, the light is incident on the upper face of the diffraction grid 5, so as to enter the detector across the diffraction grid 5. In this case, the grid is not metallized.

Accordingly, in this detector the light is detected in the quantum wells forming the active zone. This active zone is smaller than the light-collection surface (surface of the diffraction grid), thereby making it possible to reduce the dark current and increase the detection sensitivity of the detector.

In practice, the total surface area $S_t$ of the detector can remain identical to that currently used in conventional detectors (square having sides measuring 40 to 100 µm for matrices, or larger for bars or monoelements). Using a method explained below, a large part of the active zone is made non-absorbent and non-conductive. The active zone is reduced to a surface area $S_a$. The dark current is reduced thereby by a factor of $S_t/S_a$.

The incident photons on the entire surface area $S_t$ are diffracted within the pixels. At the grid resonance, the orders 1 and −1 of diffraction are propagated parallel to the surface. The photons are thus propagated toward the active zone (or toward the edge, where they are reflected toward the active zone), where they are absorbed. For an optimized grid, diffraction efficiency in the orders 1 and −1(percentage of photons diffracted) may approach 100% for a wavelength, and it remains high if integration is effected on a limited window (3–5 µm or 8–1 µm). Most of the photons incident on the pixel are thus absorbed, thereby leading to a photoresponse which is substantially equal to that obtained using an active zone occupying the entire pixel. The ratio of the photoresponse to the dark current is thus increased.

For doping of the active zone of approximately $5.10^{11}$ cm$^{-2}$ in wells and of barriers possessing thicknesses of 6 nm and 30 nm respectively, it is possible to estimate the absorption length for propagation in the plane of the layers of approximately 1.5 µm, if capture of the photons using the active zone is good (presence of a guide structure or a thick active zone).

It thus becomes possible to reduce the active zone to the length $l_{ZA}$ of approximately 1.5 µm (in practice a little more, and all photons propagated parallel to the layers will be absorbed.

Figure 2:
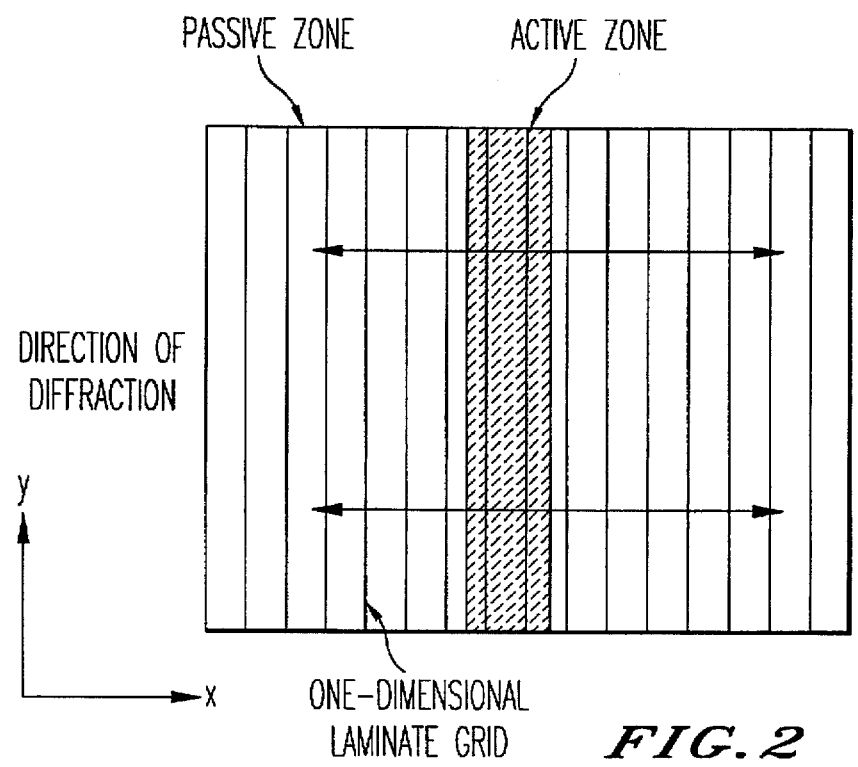
FIG. 2 is an example of the configuration of a linear grid applicable to the detector in FIG. 1.

In a structure incorporating a grid in a direction (Y) such as that illustrated in FIG. 2, the photons are diffracted perpendicularly to the grid. A thin active zone parallel to the grid (in direction Y) will allow absorption of the polarized component TM (Magnetic Transversal) of the diffracted light. Its surface is $l_{ZA} \times d$.

Figure 3:
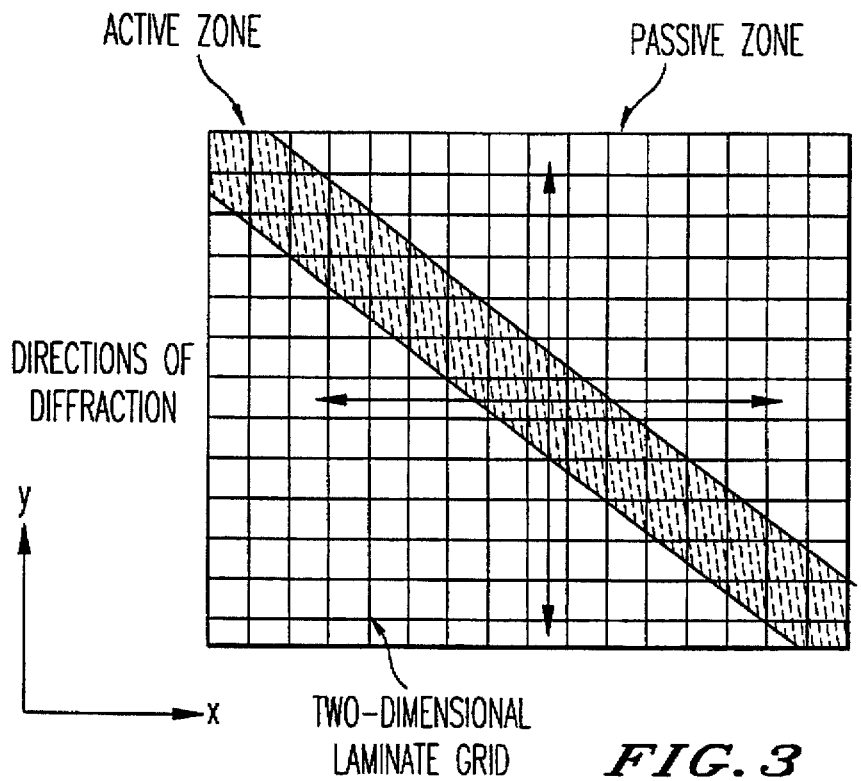
FIG. 3 is an example of the configuration of a matrix grid applicable to the detector in FIG. 1.

For a two-dimensional coupling grid (paving of squares periodically arranged along x and y), such as that shown in FIG. 3, the directions in which diffraction occurs are numerous, but the greatest part of the light is diffracted in the two perpendicular directions x and y.

In this case, an active zone along a diagonal will allow absorption. Its surface area is $l_{ZA} \times d\sqrt{2}$.

Figure 4:
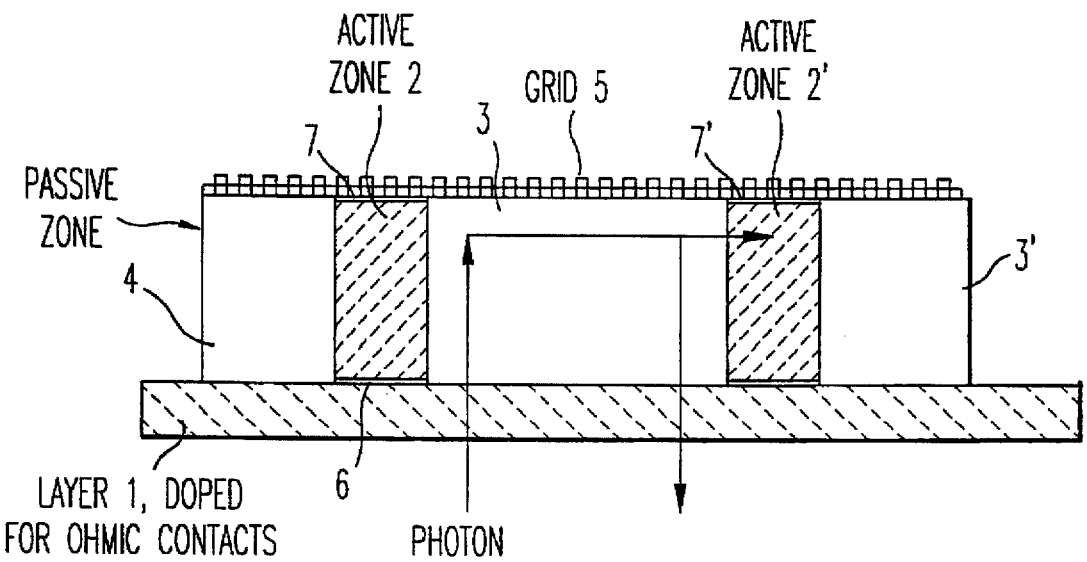
FIG. 4 illustrates a variant embodiment of the detector according to the invention.

The gain for the ratio dark current/photoresponse is $d/l_{ZA}$ in the first case, and $d/l_{ZA}\sqrt{2}$ in the second. For pixels in which d=50 µm, the gain is approximately 10 if $l_{ZA}$=5 µm. It may be greater, since the two examples above are provided solely as illustrations. The principle may be extended to other types of geometries: circular pixel with a grid in the form of concentric rings and the active zone in the center, etc. The application to detectors having large surface areas (greater than 1 mm$^2$) is especially important. In this case, one may be led to repeating several times the arrangement of the active zones in the detector. Accordingly, FIG. 4 shows two active zones 2 and 2' separated by a passive area, the whole being covered by a diffraction grid. In fact, a diffracted photon being propagated in the plane of the layers tends to become coupled to the grid, so as to be diffracted once again toward the substrate and thus, to escape detection. An optimal length between the active zones must be found. It appears that this length must be several hundreds of microns, which would give large $S_t/S_a$ ratios.

The addition of a guide structure AlAs layer, for example) beneath the active area is advantageous, particularly in the case of large surface areas, in order to guide the photons to the active area and to increase their capture in the wells.

We will now describe an example of the process of manufacture of a detector of this kind.

First, a stack of layers forming one or several quantum wells is produced on a conductive surface of a substrate 1. Within this stack of layers, an active zone is delimited by making non-absorbent and non-conductive the parts of this stack of layers not located within this active zone.

Various methods are possible to making this stack of layers non-absorbent and non-conductive, including, for example, one of the following:

1. Implantation: An implantation of protons in the zone to be made passive reduced the number of free carriers, thereby decreasing absorption and thermic current. This technique is widely used in microelectronics and is completely controlled as regards the profile (energy of the ions) and quantity (exposure time). Implantation has already been used to partially passivate samples with GaAs quantum wells used for doubling the frequency.

2. Etching the active zone and repetition of GaAs epitaxy (MBE, CVD, etc.). If good selectivity can be achieved (deposit of a layer of a different kind on the active area to prevent resumption of growth), epitaxy will be carried out solely in the etched zone. If not, the structure must be made planar after the second epitaxy by means of chemical etching or RIE.

In these two examples, the passive part of the detector is made of GaAs or GaAs+AlGaAs. The optical index is substantially the same as in the active zone. The crystallographic quality of the passive area is not an important parameter.

3. Etching of the passive zone and deposit of a dielectric non-absorbent at active wavelengths: $SiO_2$, $Si_3N_4$, polymers, ZnSe, etc.

When the index of the passive zone differs from that of the active zone, the coupling grid must have a different spacing in the two zones. These differing indices create reflections at the active area/passive area interface, but can be used to confine the light within the active zone having the higher index.

Electrodes 6, 7 are positioned on either side of the stack of layers for detection of currents resulting from photon absorption.

In all cases, the edges of the pixel are metallized (and, potentially, passivated, then metallized) to increase photon reflection toward the interior of the pixel, and to completely suppress cross-talk between pixels.

We claim:

1. Quantum well detector for the detection of optical waves within a determinate range of wavelengths, wherein said detector comprises:

on a delimited area (20) of one face (10) of a substrate (1), a stack of layers (2) forming at least on quantum well capable of detecting optical waves;

on either side of said area (20) and on the same face (10) of the substrate, at least one layer (3, 4) of a transparent material which does not absorb optical waves and which has a thickness substantially equal to that of the stack of layers (2);

above the stack of layers (2) and the layer of transparent material (3, 4), a diffraction grid (5) whose surface area is larger than that of the area (20) occupied by the stack of layers;

a first conductive electrode positioned on the substrate in contact with the stack of layers (2), and a second conductive electrode (7) positioned on the stack of layers (2).

2. Detector according to claim 1, wherein said substrate (1) is transparent to optical waves and said grid is metallized.

3. Detector according to claim 1, wherein said grid (5) is transparent and functions as a transmitter.

4. Detector according to either of claims 2 or 3, wherein said substrate is a material having an index of refraction greater than those of the materials forming the stack of layers (2) and of the layer of transparent material (3, 4).

5. Detector according to claim 1, wherein said stack of layers (2) forms a quantum multiple well.

6. Detector according to claim 1, wherein said grid (2) comprises linear, parallel elements.

7. Detector according to claim 1, wherein said grid (2) comprises elements arranged as a matrix grid and the zone (20) occupied by the stack of layers has the form of a strip positioned at 45 degrees to the matrix grid.

8. Detector according to either of claims 6 or 7, wherein said grid is a raised grid, metallized or not, or a grid composed of metallized strips.

9. Detector according to claim 1, wherein said detector comprises several zones (20, 20'), each of which comprises a stack of layers (2, 2') separated by transparent material (3), said diffraction grid (5) covering the different stacks of layers.

* * * * *